United States Patent [19]

Hölzler et al.

[11] 4,266,169
[45] May 5, 1981

[54] ELECTROMECHANICAL CONTROL DEVICE FOR DISPLACING AN OBJECT

[75] Inventors: Georg Hölzler, Moehrendorf; Jochem Knoche, Nuremberg, both of Fed. Rep. of Germany

[73] Assignee: Siemens Aktiengesellschaft, Berlin & Munich, Fed. Rep. of Germany

[21] Appl. No.: 115,001

[22] Filed: Jan. 24, 1980

[30] Foreign Application Priority Data

Mar. 14, 1979 [DE] Fed. Rep. of Germany ....... 2910012

[51] Int. Cl.³ .............................................. G06F 3/14
[52] U.S. Cl. .................................. 318/490; 318/565; 340/366 CA; 324/121 R
[58] Field of Search ............... 318/565, 490, 603, 588; 340/366 CA, 378.5; 324/121 R

[56] References Cited

U.S. PATENT DOCUMENTS

| | | | |
|---|---|---|---|
| 3,760,405 | 9/1973 | Ishii et al. | 340/366 CA |
| 3,795,013 | 2/1974 | McKinley | 318/603 X |
| 3,909,691 | 9/1975 | Wilson et al. | 318/490 |
| 4,009,464 | 2/1977 | Grimes et al. | 318/565 X |
| 4,204,144 | 5/1980 | Hill | 318/490 X |

FOREIGN PATENT DOCUMENTS 2719118  1/1978  Fed. Rep. of Germany .

Primary Examiner—B. Dobeck
Attorney, Agent, or Firm—Hill, Van Santen, Steadman, Chiara & Simpson

[57] ABSTRACT

An electromechanical control device for displacing and positioning an object such as a marker on a cathode ray tube screen has at least one control column normally biased in a central rest position which is manually displaceable against the bias in directions corresponding to coordinate axes on the screen. Displacement of the column operates a slide potentiometer which supplies an input voltage to a voltage controlled oscillator which produces an output pulse train which controls movement of the object to be displaced. The object to be displaced moves to a final position with a velocity determined by the amount of displacement of the control column. The final position of the object is achieved by incremental step movements of the column, with column movement controlling velocity and direction of movement only, with magnitude being controlled by an operator. A post-connected counter maintains the object in a specified position after release of the displacement column, thereby freeing an operator's hands while still maintaining the object in the desired position.

8 Claims, 3 Drawing Figures

ELECTROMECHANICAL CONTROL DEVICE FOR DISPLACING AN OBJECT

BACKGROUND OF THE INVENTION

1. Field of the Invention

The present invention relates to electromechanical positioning devices, and in particular such devices utilized in combination with a cathode ray tube for positioning markers on a screen of the tube.

2. Description of the Prior Art

Control devices which displace an object in response to directional movement of a control column by an operator are known in the art. Such control devices have versatile application, and may be used in model construction technology for controlling the rudders of model ships or the flaps of model airplanes. Such devices have further application in the control of directional antennas.

Another application of such control devices is that of positioning markers on the screen of a cathode ray tube, and in particular the positioning of markers for determining the distance between two points of an image appearing on the screen. An example of a control device of this type for use with an ultrasonic image apparatus is known in German OS No. 2,719,118. Conventional control devices of this type generate position signals for displacing the marker which are proportional to the amount of movement of a control means by an operator in a particular direction. Continued maintenance of a particular position of the marker is possible only as long as the control means remains depressed or deflected by the operator. A problem in the art in utilizing conventional positioning devices of this type is that maintaining a marker in a particular position continuously occupies the hands of an operator making use of other controls difficult or impossible. A further problem in the art is that a precise positioning is dependent upon the steadiness of the operator's hand, because any movement of the control means, however slight, will produce a corresponding movement of the marker of the screen.

SUMMARY OF THE INVENTION

It is an object of the present invention to provide an electromechanical control device which allows positioning of an object and maintenance of the position with a minimum of time during which an operator's hand is occupied.

It is another object of the present invention to provide an electromechanical control device which maintains an object to be displaced in a selected displaced position without continued actuation of the control device by an operator.

The above objects are achieved in the present invention by the use of spring-biased control columns which are normally maintained by the bias in a central rest position. The control columns are displaceable in directions corresponding to a coordinate system on a cathode ray tube screen and operate slide potentiometers which produce an output voltage for operating a voltage controlled oscillator which produces a pulse train having a frequency determined by the amount of displacement of the control column. The pulse train from the voltage controlled oscillator determines the velocity of movement of a marker from an initial position to a final position, with the direction of movement being determined by the direction of deflection of the control column.

The marker is brought to a final position by incremental step movement of the control column. A counter which is post-connected to the voltage controlled oscillator determines the highest count of the oscillator output in a particular direction with the count ceasing when the control column returning to the central rest position. The count is utilized to maintain the marker in the final position until a new position signal is entered by subsequent displacement of the control column.

The movement of the control column thus directly controls only the direction and velocity of the marker movement, with the magnitude of the movement being selected by the operator by incremental fine step displacements as the marker approaches a desired final position. The object to be displaced can therefore be brought quickly in the direction of the desired final position by large deflection of the control column. The marker is maintained in the selected final position by the counter output thereby freeing the hands of the operator to manipulate other controls. Further, continued maintenance of the marker in the final position is insured because the marker is electronically maintained in the final position, rather than being dependent upon maintaining the control column in a steady, displaced position as in conventional control devices.

Further advantages and details of the invention will become apparent from the following description of an 1xemplary embodiment and on the basis of the associated drawings.

DESCRIPTION OF THE PREFERRED EMBODIMENTS

Figure 1:
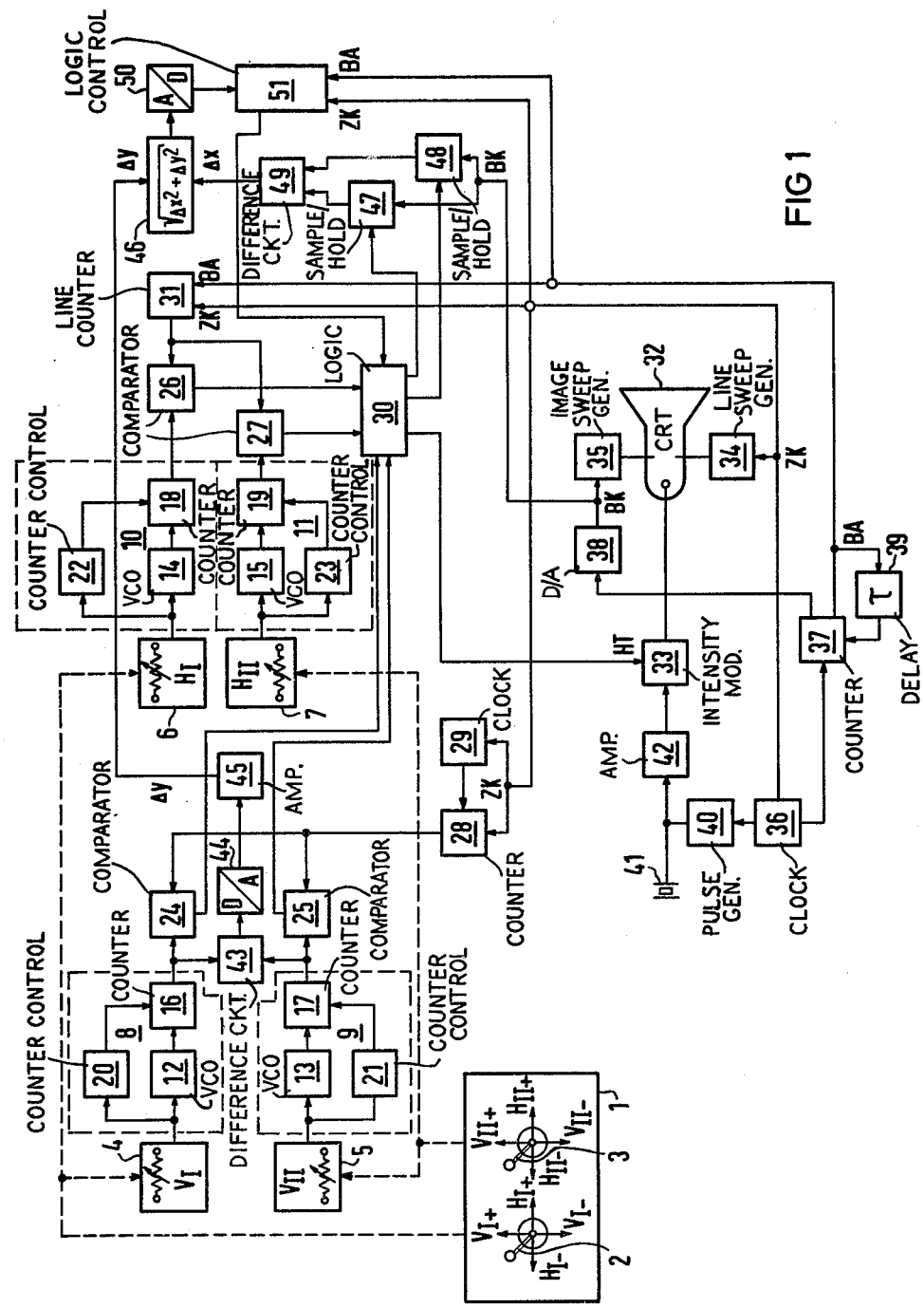
FIG. 1 is a basic circuit diagram of an electromechanical control device constructed in accordance with the principles of the present invention for displacing a marker on the screen of a cathode ray tube in an ultrasonic image apparatus.
Figure 2:
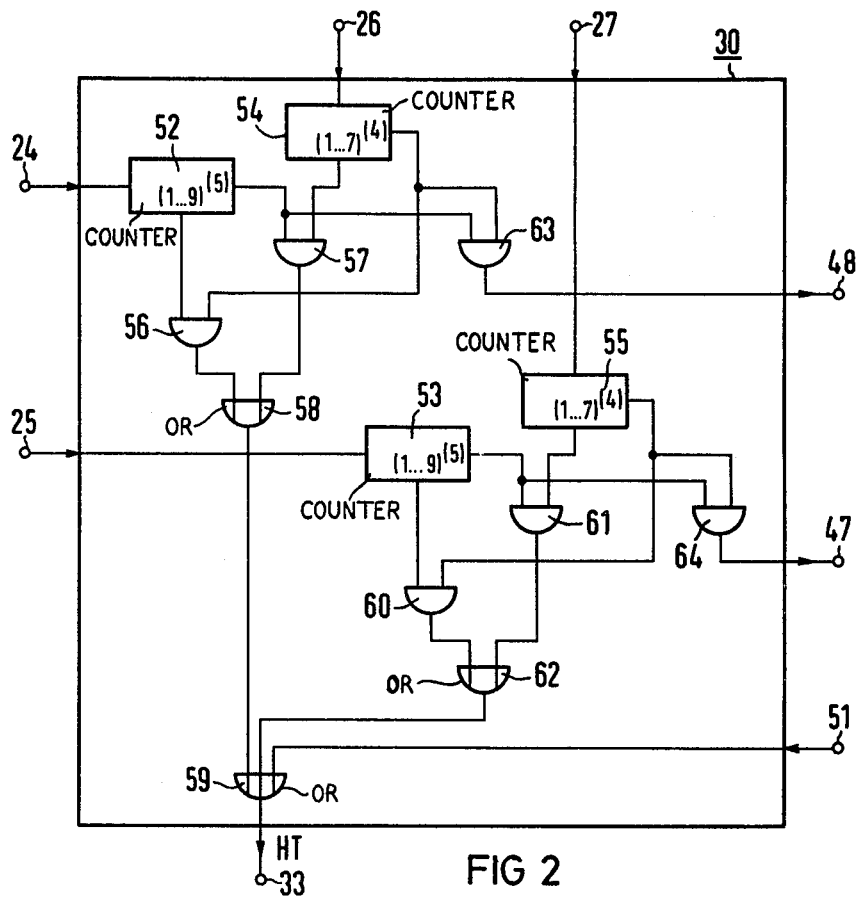
FIG. 2 is a detailed circuit diagram of the logic circuitry referenced at 30 in FIG. 1.
Figure 3:
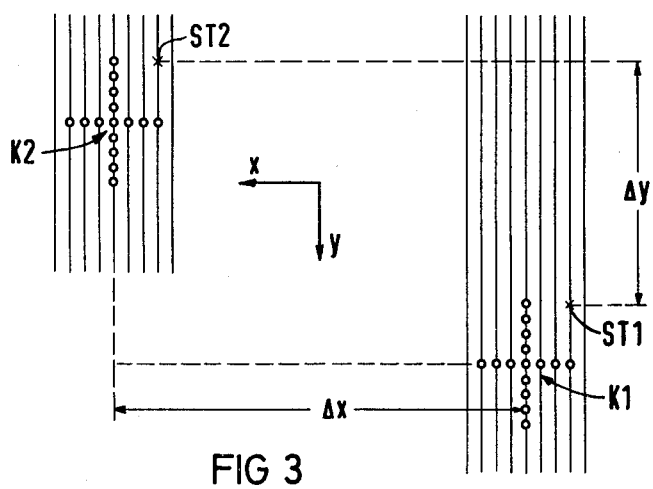
FIG. 3 is a schematic drawing showing values utilized to determine the positioning of two markers utilizing the circuits of FIG. 1 and 2, wherein the markers are in the form of crosses.

The following description in conjunction with the FIGS. 1, 2 and 3 is an exemplary embodiment of the present invention utilized in combination with a cathode ray tube for positioning a marker on the screen of the tube. It will be understood to those skilled in the art that the inventive concept disclosed herein is not limited to this particular use, but has further application for the positioning of any type of displaceable object utilizing relatively low voltage levels.

In the embodiment shown in FIG. 1, a control panel 1 has control columns 2 and 3 thereon for controlling movement of markers on a screen of a cathode ray tube 32. Each control column controls one marker, and any number of columns and associated markers may be utilized without departing from the inventive concept herein. Each control column is maintained in a central position by a spring biasing system as is known in the art and may be displaced in the vertical and horizontal directions by an operator. Displacement is maintained only as long as the operator maintains contact with the column, with the spring bias returning the column to the central position as soon as the operator removes his or her hand. The control column 2 is moveable along a vertical axis $V_I$ and along a horizontal axis $H_I$, and the control column 3 is moveable along a vertical axis $V_{II}$ and along a horizontal axis $H_{II}$. As shown in FIG. 1, opposite directions of movement along each axis are designated with a plus sign and a minus sign as representing movement in positive and negative directions. The point of intersection of the axes establishes the central or rest position of each control column.

The control column 2 is mechanically connected to the sliding contact of a resistance potentiometer 4 for controlling movement in the vertical direction and a resistance potentiometer 6 for controlling movement in the horizontal direction. Similarly, the control column 3 is connected to resistance potentiometers 5 and 7 for respective control of vertical and horizontal deflection. When each control column 2 and 3 is in the central position, the slide of each potentiometer is located in the center of the resistance path. The resistance path of each potentiometer 4, 5, 6 and 7 is connected on one side to a positive voltage $U_+$ and is connected at the other end to an equal opposite voltage $U_-$. Positioning of each potentiometer slide in the center position thus results in an output voltage of zero. Movement of the control columns 2 and 3 along any axis thus moves a potentiometer slide and produces a positive or negative output voltage from the potentiometer having a magnitude corresponding to the amount of displacement of the control column.

The control columns 2 and 3 thus form a proportional signal generator in combination with the potentiometers 4, 5, 6 and 7 which produces a deflecting voltage having a polarity and amplitude proportional to the movement of the control column in the particular coordinate direction. In contrast to conventional positioning devices, however, this signal is not directly utilized to move or deflect the marker, but is rather subjected to further processing as described below.

The subsequent processing is undertaken to convert the deflection amplitude of the control column into a velocity signal for controlling the velocity of the marker to be displaced. This is implemented by utilization of conversion circuitry generally designated at 8, 9, 10 and 11 respectively connected to the outputs of the potentiometers 4, 5, 6 and 7. Each conversion circuit includes a voltage controlled oscillator, referenced at 12, 13, 14 and 15; a counter, referenced at 16, 17, 18 and 19; and a counter control, referenced at 20, 21, 22 and 23. Each voltage controlled oscillator has its input connected to the output of the respective potentiometer, so that the frequency of the output pulse train produced by the oscillator is controlled by the voltage magnitude produced by movement of the control columns 2 and 3 in a particular coordinate direction. Thus the frequency of the output pulse train of the voltage controlled oscillator is greatest when the control column is displaced a greatest distance from the central position.

The pulses produced by the voltage controlled oscillators are counted by post-connected up/down counters 16, 17, 18 and 19. Switching from an up count to a down count and vice versa is achieved in each conversion circuit by a counter control 20, 21, 22 and 23 respectively associated with each counter. The counter control provides an output signal for switching the counter direction in response to a corresponding change in the polarity of the output voltage of the associated potentiometer.

In the exemplary embodiment of FIG. 1, the conversion circuits 8 and 9 establish the velocity of the displacement of a measuring marker in a vertical direction on the screen of a cathode ray tube 32. In this application, it is advantageous to superimpose the vertical direction of marker deflection with the deflection direction of a line generated by a conventional sweep generator 34 used in conjunction with the cathode ray tube. When used with a conventional cathode ray tube display, the voltage controlled oscillators 12 and 13 are operable in the range of zero to fifty kiloherz. The capacity of the up/down counters 16 and 17 is then 12 bits. This provides a resolution of 4,096 steps per deflection line.

The horizontal resolution in conventional cathode ray tube displays is generally limited to 256 steps, for example. This means that voltage controlled oscillators 14 and 15, associated with the horizontal deflection, may have a smaller frequency range, such as zero to 10 kiloherz. The up/down counters 18 and 19 similarly require a smaller capacity, which may be 8 bits.

Each counter 16, 17, 18 and 19 acts as an arresting device by monitoring the input pulses and retaining a value which is substantially the highest value and thereafter continuously providing an output at such highest value to maintain the object to be displaced in the position corresponding to the highest value. This is achieved by providing within each counter a decoupling circuit as is known in the art which monitors the frequency of the input pulse train from the associated voltage controlled oscillator and decouples the associated counter from the oscillator when the pulse train frequency falls below a certain percentage of a highest value which has been received to that time. The threshold percentage may be selected in accordance with individual requirements.

The counter controls 20, 21, 22 and 23 associated with the respective counters provide a signal to the counters directing a change in counting direction only if the control columns 2 or 3 passed through the rest position first. For example, if the control column 3 is moved a distance in the $V_{II}+$ direction, and is then returned to the rest position, the counter control 21 will direct the counter 17 to count only in the forward direction. If, however, the control column 3 is moved first to the $V_{II}+$ direction and is then moved a distance in the opposite direction $V_{II}-$, the counter control 21 will switch the counting direction of the counter 17 because the control column 3 has passed through the rest position.

Measuring markers are generated by circuitry more fully described below, however, positioning of such markers is undertaken by the following procedure. The final position of a measuring marker is achieved by a total of individual stepped inputs resulting from coarse and fine movements of the control columns 2 and 3 by the operator. Each deflection is first undertaken in the direction of one coordinate axis, with the other coordinate position then being subsequently fixed. An operator first displaces one of the columns 2 and 3 with a large displacement in the direction of one of the coordinate axes associated with the quadrant in which the marker is to be moved. This large displacement results in an initially rapid movement of the marker to a selected position. The associated resistance potentiometer produces a high output voltage which results in a high frequency pulse train from the associated voltage controlled oscillator. The counter connected to the output of the oscillator counts at a high level and the marker is correspondingly quickly displaced as a function of the output signal of the counter in the specified coordinate direction. Fine adjustment can then take place by smaller movements of the control columns 2 and 3 which result in slower, more precisely controlled, movement of the markers. When the final position of a particular coordinate direction is reached, the control column is returned to the central rest position and the frequency of the associated voltage controlled oscillator returns to zero so that no further pulses are generated and the previously attained highest counter reading of the associated up/down counter is stored as the position of that coordinate. An identical operation is then undertaken to position the marker in the other coordinate direction. The highest output of the up/down counter associated with that coordinate direction is also stored, resulting in the measuring marker being precisely maintained in the final position without the necessity of the operator continuously maintaining the control columns 2 and 3 in a displaced position. Because operation of the control columns controls only direction and velocity of marker displacement, and not the magnitude thereof, a continued output of the counter at the highest level is all that is necessary to maintain the markers in the preselected position, regardless of the position of the control columns.

When further movement to a new position is desired, the counters can be reset to zero by any suitable means, such as a separate reset control or by a reset control built into the control panel 1 which is activated upon a minimum deflection of the control columns 2 and 3 from the central position.

The measuring marker itself may have any form, such as a point or a circle or, as shown in FIG. 3, a cross. In the embodiment shown in FIG. 3, the marker consists of a vertical line consisting of nine points and a horizontal line consisting of seven points. The lines intersect perpendicularly at their midpoints. The lines may be comprised of any number of points without departing from the inventive concept herein.

The correct positioning of the points comprising the marker crosses on the screen of the tube 32 can be achieved only if the up/down counters 16, 17, 18 and 19 are synchronized in the vertical direction with the deflection velocity of the sweep lines on the screen and in the horizontal direction with the line displacement velocity. In the embodiment shown in FIGS. 1 and 2, this is achieved by the use of comparators 24, 25, 26 and 27 respectively connected to the counters 16, 17, 18 and 19. The comparators 24 and 25 compare the counter reading of the counter 16 and 17 with the counter reading of a counter 28. The counter 28 is enabled by a line trigger pulse ZK which is generated by a clock 36 for use with the line sweep generator 34. The trigger pulse ZK also enables a clock generator 29 which may be a quartz 14 megaherz generator. When the output of the counter 16 or 17 equals the output of the counter 28, a signal is transmitted from the respective comparator 24 or 25 to a control logic circuit 30, more fully detailed in FIG. 2, which generates the marker crosses.

Similarly, horizontal synchronization is undertaken by comparators 26 and 27 which respectively compare the counter reading of the up/down counters 18 and 19 with the counter reading of a line counter 31 which is enabled by the image trigger pulse BA and is counted to a level in synchronization with the trigger pulse ZK. When the counter readings are equal a signal for the control logic circuit 30 is respectively produced by one of the comparators 26 or 27. On the basis of the comparator output signals provided to the control logic circuit 30, an intensity modulation pulse HT is generated as more fully described below.

The inventive concept disclosed herein may be utilized with conventional cathode ray tube display circuitry which is schematically represented in the lower portion of FIG. 1. The intensity modulation pulses HT are supplied to an intensity modulation device known in the art referenced at 33. As identified above, the cathode ray tube 32 has a line sweep generator 34 and an image sweep generator 35. Both sweep generators are controlled by a central clock 36, which produces sweep triggering pulses ZK. The pulses of the clock 36 are also transmitted to a counter 37 which generates image sweep pulses BK through a digital/analog converter 38, and also produces the image triggering pulses BA are generated as is known in the art by the use of a delay circuit 39 having a delay $\tau$. The clock 36 also transmits a third output to a high frequency pulse generator 40. The high frequency pulse generator 40 produces high frequency pulses for an ultrasonic transducer 31 which are synchronized with the pulses of the clock 36. Echo pulses resulting from a test object are transmitted through an amplifier 42 in a manner known in the art to the intensity modulation device 33 for modulating the brightness of the lines on the screen as a function of the echo signals. The ultrasonic transducer 41 is only schematically represented in FIG. 1 and may be a displaceable signal resinator having a construction known in the art. Alternatively, an ultrasonic array having a number of ultrasonic generators may be utilized, as well as a self-rotating resinator having a parabolic relfector. The particular circuitry utilized in operating the cathode ray tube 32 is not a part of the invention disclosed herein, and any suitable display circuitry for operating the tube may be utilized in connection with the invention.

The utilization of markers in the shape of crosses, as shown in FIG. 3, presents a problem in generating the markers which is not encountered if a marker consisting of a single point is utilized. The point in the marker which actually "marks" the position of the cross is the central point which the intersection of the vertical and horizontal lines. In each coordinate direction, therefore, a number of points precede the central point and these points must be plotted as part of the marking cross before the actual center point is plotted. This is achieved as follows. As shown in FIG. 3, two marking crosses K1 and K2 each have a starting time point associated therewith for starting the plotting of the marker before the actual center point of the cross is reached. As shown in FIG. 3, for example, a horizontal deflection may take place from top to bottom in the y-direction and the build-up of the picture by displacing the line from right to left in the x-direction. The starting time points for plotting the crosses K1 and K2 are referenced respectively as ST1 and ST2. The coordinate position of the starting points ST1 and ST2 are already detected through the parity of the signals at the comparators 24, 25, 26 and 27. Because the distance of these starting points corresponds in the line direction to each of the points of intersection of the crosses K1 and K2 which are to be constructed, the distance between the points ST1 and ST2 can be ascertained before the start of a plotting function and designated as $\Delta y$. A subtracting element 43, which may an operational amplifier, is connected to the output of the up/down counters 16 and 17 for this purpose.

The difference Δy determined by the subtracting element 43 is transmitted through a digital/analog converter 44 and a decoupling amplifier 45 to a calculating circuit 46.

The path distance Δx in the horizontal direction is not necessarily ascertained directly as a distance value between the points ST1 and ST2. The distance Δx is rather measured directly between the center points of the crosses K1 and K2 so that possible distortions resulting from slightly skew lines are avoided. If, however, a parallel relation of the lines within acceptable deviations is present, Δx can be determined exactly as Δy by measurement between ST1 and ST2. Counters within the control logic circuitry 30, as more fully described below, ascertain the horizontal distance Δx.

When the center point of the crosses K1 and K2 occurs, respectively connected sample/hold circuits 47 and 48 are each activated by the counters in the control logic circuit 30 and as a result read and hold the current value of the image sweep voltage BK. This current value, however, corresponds directly to the x-coordinate of the center point of a cross. At the output of the sample/hold circuits 47 and 48 the difference Δx is thus determined by a subtracting element 49, which may also be an operational amplifier.

The magnitudes of Δx and Δy are thus supplied to a calculating circuit 46 known in the art to calculate the distance $$\sqrt{\Delta x^2 + \Delta y^2}.$$

The distance value thus ascertained is transmitted through an analog/digital converter 50 to a control circuit 51 known in the art for superimposing the indicated value on the screen of the tube 32 through the other control logic circuitry 30. Alternatively, an integrator may be utilized in place of the subtracting element 49 and the calculating circuit 46 may be utilized to determine $\Delta y^2$ directly by integrating the area between the scanning values of the image sweep voltage BK. The distance Δx may also be directly determined by integrating the line sweep voltage ZK. The sum $\Delta x^2 + \Delta y^2$ can then be obtained by simple addition with an operational amplifier and the square root of that value can be obtained by utilizing a quadratically adjusted indicator.

The generation of the crosses K1 and K2 as a function of the signals from the comparators 24, 25, 26 and 27 is described below in conjunction with FIG. 2, which shows in detail the components of the control logic circuit 30. The comparator signals produced at the starting points ST1 and ST2 from the comparators 24, 25, 26 and 27 are respectively transmitted to counters 52, 53, 54 and 55. The counters 52 and 53 are vertical counters for the intensity modulation points in the vertical bar of a cross, and the counters 54 and 55 are horizontal counters for the intensity modulation of points in the horizontal bar of a cross. Accordingly, each of the two counters 52 and 53 count the maximum number of intensity modulation points along a line at a first output referenced (1 . . . 9). With each counting pulse an output pulse is generated and supplied to one of the outputs of an AND gate 56. Furthermore, each fifth counting pulse is transmitted from a second output of the counter 52 referenced at (5) to a second AND gate 57. Both AND gates 56 and 57 have their other inputs connected to outputs of the horizontal counter 54.

The horizontal counter 54 counts at a first output referenced (1 . . . 7) from one to seven and supplies output pulses to one input of the AND gate 57. Each fourth pulse is transmitted from a second output of the counter 54 referenced at (4) to the other input of the AND gate 56. Both AND gates 56 and 57 are connected at their outputs to an OR gate 58 which in turn has an output which serves as one input to a multiple input OR gate 59 for generating the intensity modulation pulses HT from the control logic circuit 30.

By this method of connecting the counters 52 and 54, output pulses to the intensity modulation device 33 are provided in a specific pattern. After a start signal ST1 in each case a pulse appears after each fifth clock pulse per line at the output (5) of the vertical counter 52 and at the output (1 . . . 7) of the horizontal counter 54 simultaneously. The electron beam of the cathode ray tube is thus intensity-modulated in synchronization with the seven output pulses of the counter 54 and the seven points of the horizontal cross bar are produced. Nine output pulses appear simultaneously with the pulse at the output (4) of the horizontal counter 54 during the course of the horizontal deflection at the output (1 . . . 9) of the vertical counter 52. Thus nine intensity-modulation pulses appear through the AND gate 56 and the OR gates 58 and 59 to produce the vertical bar of the crosses K1. Identical operation controls generation of the cross K2, which is produced by means of a vertical counter 53 and a horizontal counter 54 connected to AND gates 60 and 61 which have outputs serving as inputs to an OR gate 62 whose output serves as another input to the multiple input OR gate 59. The other input to the OR gate 59 is the output from the logic control circuitry 51.

The above-described control logic 30 for generating the markers therefore insures that the appropriate points of each cross bar of each cross can be represented without loss of information precisely on the assigned screen lines comprising the ultrasonic echo monitor image on the screen of the cathode ray tube 32. In addition, the use of the vertical and horizontal counters also provides the means for measuring the distance between the points of intersection of the two crosses K1 and K2. The point of intersection of a cross K1 or K2 is defined in terms of time by the coincidence of two counting pulses, EG, of the fourth pulse at the output (4) of one of the horizontal counters 54 or 55 and the fifth counting pulse at the output (5) of one of the vertical counters 52 and 53.

Further, as shown in FIG. 2, the outputs (4) and (5) of the respective counters 54 and 52 are inputs to an AND gate 63, and the outputs (4) and (5) of the counters 55 and 53 are inputs to an AND gate 64. A pulse is therefore always produced at the outputs of the AND gates 63 and 64 respectively when the electron beam of the cathode ray tube 32 is located at the center point of a cross K1 or K2. The presence of an output pulse that either AND gate 63 or 64 triggers the sample and hold circuitry 47 and 48 respectively connected thereto and effects the scanning of the instantaneous value of the image sweep voltage BK in the points of intersection in order to make a subtraction for the purpose of ascertaining the distance Δx.

Although modifications and changes may be suggested by those skilled in the art it is the intention of the inventors to embody within the patent warranted hereon all changes and modifications as reasonably and properly come within the scope of their contribution to the art.

We claim as our invention:

1. An electromechanical positioning device for generating electric signals to displace an object from an initial position to a selected final position comprising:
   a manually operable control means normally maintained in a rest position, said control means moveable in directions corresponding to directions of movement of the object to be displaced;
   a deflection signal generator mechanically connected to said control means for generating a signal having a magnitude directly proportional to the amount of movement of said control means and having a polarity corresponding to the direction of movement;
   a means for moving said object to be displaced in response to said deflection signal; and
   an arresting means connected to said signal generator, said arresting means monitoring said deflection signal and retaining a highest value of said deflection signal after said control means is returned to said rest position, said arresting means further maintaining an output at said highest value to maintain said deflection signal and thereby hold said object in the final position corresponding thereto with said control means in said rest position.

2. The device of claim 1 wherein said arresting means is a unit comprising:
   a memory addressable by said deflection signal generator for storing said highest value, and
   a coupling-decoupling means connected to said memory which couples said memory to said deflection signal generator and monitors the inputs to said memory and which decouples said memory from said deflection signal generator when the magnitude of said memory inputs falls below a preselected percentage of a highest input value.

3. The device of claim 2 wherein said coupling-decoupling means couples said deflection signal generator and said memory after a decoupling thereof only if said control means is returned to a rest position.

4. The device of claim 1 wherein said deflection signal generator comprises:
   a slide potentiometer having a slide mechanically connected to said control means for co-movement therewith, said potentiometer having two terminals respectively connected to equal and opposite sources of potential;
   a voltage controlled oscillator connected to said potentiometer for generating a pulse train having a frequency which increases with increased displacement of said control means and said potentiometer slide; and
   a counter connected to the output of said voltage controlled oscillator for generating a deflection signal for moving said object to be displaced in a direction corresponding to the direction of movement of the control means and at a velocity corresponding to the magnitude of movement of said control means.

5. The device of claim 4 wherein said deflection signal generator further comprises an up/down counter having an input connected to the output of said voltage controlled oscillator, and
   a counter control having an input connected to the output of said slide potentiometer, said counter control monitoring the polarity of the output of said potentiometer and providing a signal to change the counting direction of said up/down counter upon a change in potentiometer output polarity, said counter counting up if said polarity is positive and counting down if said polarity is negative, and said counter control further providing said counter direction change signal only if said control means and said potentiometer slide pass through said rest position.

6. The device of claim 1 in combination with a cathode ray tube display system having a cathode ray tube, an image sweep generator, a line sweep generator and an intensity modulation device, wherein said object to be displaced is an image on the cathode ray tube display generated by said intensity modulation device, and wherein the output of said deflection signal generator is connected through logic circuitry to said intensity modulation device for controlling the position of said image of said display screen.

7. The device of claim 6 wherein said control means is moveable along a horizontal axis and along a vertical axis and wherein a first deflection signal generator and a first arresting means are provided for generating a vertical deflection signal and wherein a second deflection signal generator and a second arresting means are provided for generating a horizontal deflection signal, further comprising:
   a clock for generating a pulse train for operating said line sweep generator;
   a first comparator having inputs respectively connected to the output of said first arresting means and to said clock for comparing the values of said inputs, said first comparator transmitting said vertical deflection signal to said logic circuitry only if the compared values are equal; and
   a second comparator having two inputs respectively connected to said second arresting means and to said clock for comparing the values of said inputs, said second comparator transmitting said horizontal deflection signal to said logic circuitry only when said compared values are equal.

8. The device of claim 6 wherein said image is a cross comprised of a horizontal row of discrete points and a vertical column of discrete points, said points generated by said intensity modulation device in response to inputs signals from said logic circuitry.

* * * * *